(12) United States Patent
Nagatomo

(10) Patent No.: US 6,787,432 B2
(45) Date of Patent: Sep. 7, 2004

(54) SEMICONDUCTOR DEVICE

(75) Inventor: Shigeru Nagatomo, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 203 days.

(21) Appl. No.: 10/207,191

(22) Filed: Jul. 30, 2002

(65) Prior Publication Data

US 2002/0180002 A1 Dec. 5, 2002

Related U.S. Application Data

(62) Division of application No. 09/637,832, filed on Aug. 11, 2000, now Pat. No. 6,452,252.

(30) Foreign Application Priority Data

Aug. 12, 1999 (JP) ............................................. 11/228642

(51) Int. Cl.[7] ............................................. H01L 21/301
(52) U.S. Cl. ......................... 438/462; 257/620; 438/113
(58) Field of Search .................................. 438/113, 458, 438/462

(56) References Cited

U.S. PATENT DOCUMENTS

| | | | |
|---|---|---|---|
| 5,875,086 A | 2/1999 | Narita | |
| 5,930,607 A | 7/1999 | Satou | 438/158 |
| 5,998,282 A | * 12/1999 | Lukaszek | 438/460 |
| 6,222,235 B1 | 4/2001 | Kojima et al. | 257/35 S |
| 6,228,766 B1 | * 5/2001 | Fujii | 438/682 |
| 6,365,443 B1 | * 4/2002 | Hagiwara et al. | 438/130 |
| 6,703,251 B2 | * 3/2004 | Terada et al. | 438/14 |
| 2002/0171116 A1 | * 11/2002 | Kelberlau et al. | 257/502 |

FOREIGN PATENT DOCUMENTS

| | | |
|---|---|---|
| JP | 60-167458 A | 8/1985 |
| JP | 04-134855 | 5/1992 |
| JP | 07-086510 | 3/1995 |

* cited by examiner

Primary Examiner—Allan R. Wilson
(74) Attorney, Agent, or Firm—Volentine Francos, PLLC

(57) ABSTRACT

A semiconductor device includes a semiconductor substrate and an internal circuitry which is formed on the semiconductor substrate and which executes a predetermined operation. The device also includes a terminal which is connected to the internal circuitry and which receives an external signal and a protection circuitry which is formed on the semiconductor substrate. The protection circuitry includes a transistor having a first region of a first conductivity type, a second region of the first conductivity type and a third region of a second conductivity type. The first region is connected to the terminal. The second region is provided at a scribe line of the semiconductor substrate. The third region is defined by a region between the first region and the second region.

4 Claims, 3 Drawing Sheets

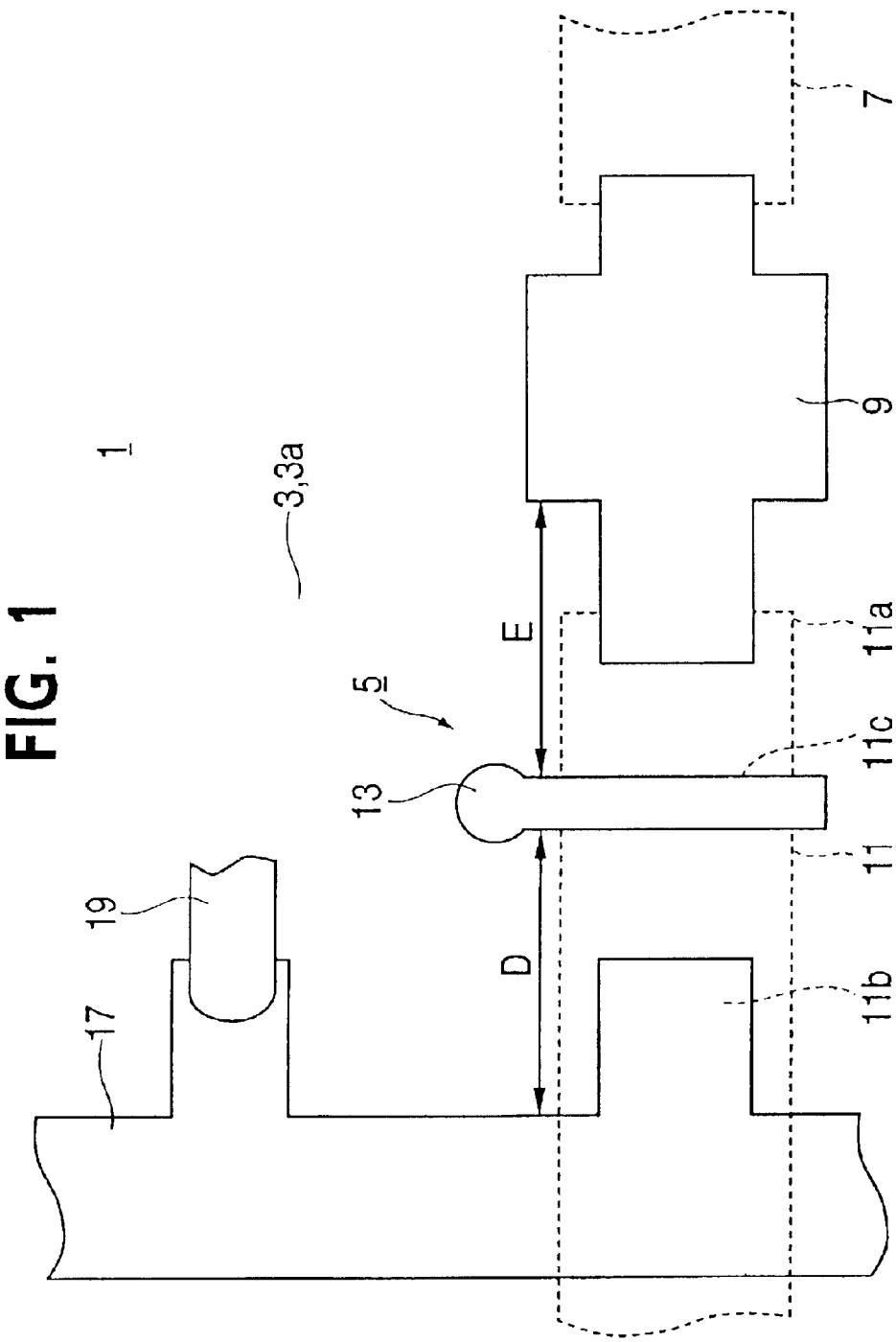

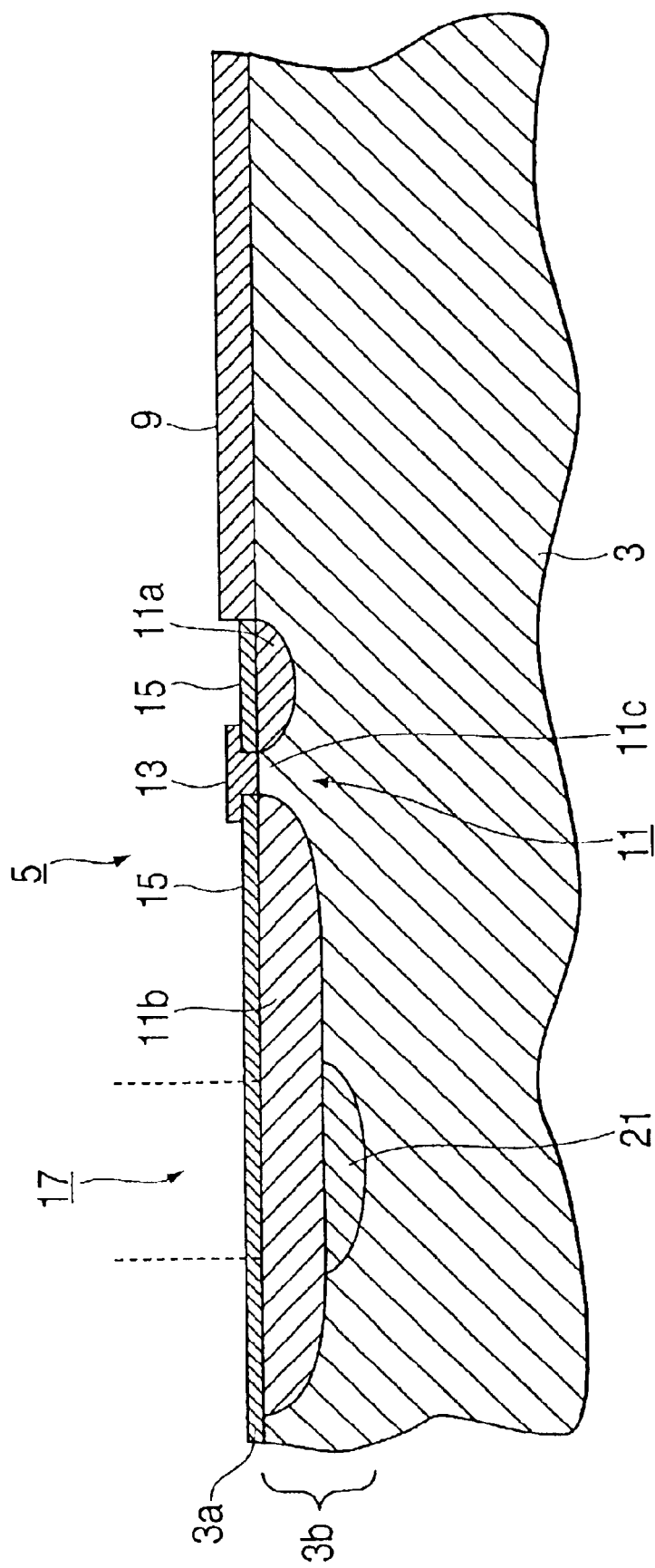

SEMICONDUCTOR DEVICE

CROSS REFERENCE TO RELATED APPLICATIONS

This is a divisional application of application Ser No. 09/637,832, filed Aug. 11, 2000 now U.S. Pat. No. 6,452,252, which is hereby incorporated by reference in its entirety for all purposes

BACKGROUND OF THE INVENTION

1. Field of the Invention

The present invention generally relates to a semiconductor device, and more particularly, to an electrostatic discharge protection circuit that protects an internal circuitry from an electrostatic discharge damage. The present invention also relates to a method of fabricating the semiconductor device.

This application relies for priority on Japanese patent application, Serial Number 228642/1999, filed Aug. 12, 1999, which is incorporated herein by reference in its entirety.

2. Description of the Related Art

An electrostatic discharge occurs in various steps such as an assembly step, a wafer processing step or a carrying step of an IC (Integrated Circuit) chip.

As an integration of the IC has been enhanced, the size of elements formed on the IC have been small in recent years. As a result, an amount of a withstanding voltage of the IC against the electrostatic discharge decreases.

In conventional IC, ESD (Electro-Static Discharge) protection circuits, which prevent an internal circuitry from breaking due to a surge voltage input from connection terminals, are provided at respective connection terminals connected to the internal circuitry.

However, since the conventional IC has the ESD protection circuits each of which is connected to corresponding connection terminal, a circuit area per one connection terminal increases. That is, a relatively large circuit area for the ESD protection circuit is needed. Therefore, the conventional IC is not suitable for a higher integration.

Consequently, there has been a need for an improved semiconductor device and method of fabricating the same.

SUMMARY OF THE INVENTION

It is an object of the present invention is to provide a semiconductor device having a smaller size.

It is another object of the present invention to provide a semiconductor device which includes a protection circuit having a smaller size.

According to an aspect of the present invention, for achieving one or more of the above objects, there is provided a semiconductor device that includes a semiconductor substrate and an internal circuitry which is formed on the semiconductor substrate and which executes a predetermined operation. The device also includes a terminal which is connected to the internal circuitry and which receives an external signal and a protection circuitry which is formed on the semiconductor substrate. The protection circuitry includes a transistor having a first region of a first conductivity type, a second region of the first conductivity type and a third region of a second conductivity type. The first region is connected to the terminal. The second region is provided at a scribe line of the semiconductor substrate. The third region is defined by a region between the first region and the second region.

The above and further objects and novel features of the invention will more fully appear from the following detailed description, appended claims, and accompanying drawings.

BRIEF DESCRIPTION OF THE DRAWINGS

FIG. 1 is a top plan view showing a part of the semiconductor device 1 according to the preferred embodiment of the present invention.

FIG. 2 is a cross sectional view showing the protection circuit 5 and the periphery of the protection circuit 5 of the semiconductor device 1.

DETAILED DESCRIPTION OF THE PREFERRED EMBODIMENT

Figure 4:
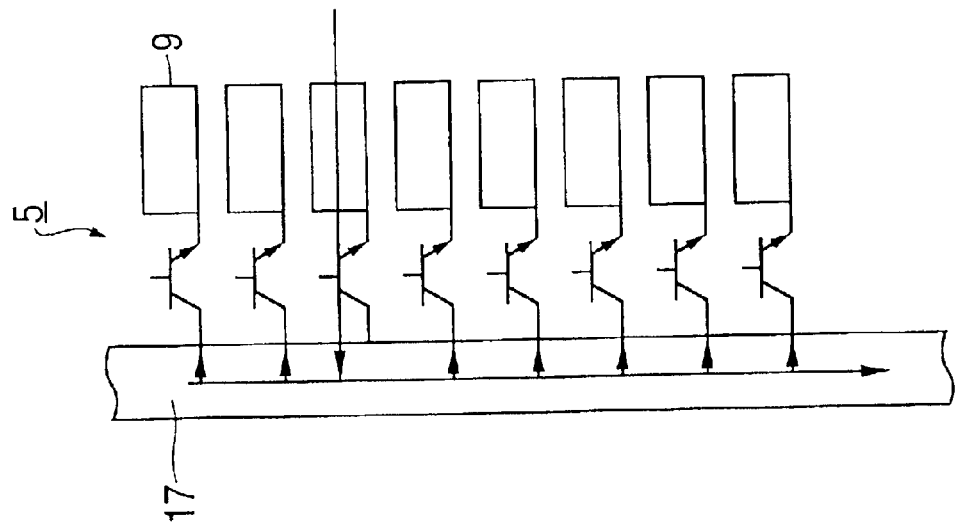
FIG. 4 is a schematic view showing a variation of the semiconductor device according to the preferred embodiment of the present invention.

A semiconductor device according to the present invention will be explained hereinafter with reference to figures. In order to simplify explanations, like elements are given like or corresponding reference numerals through this specification and figures.

First, a semiconductor device 1 according to the preferred embodiment is explained with reference to FIG. 1 and FIG. 2.

FIG. 1 is a top plan view showing a part of the semiconductor device 1 according to the preferred embodiment of the present invention. More particularly, FIG. 1 is a top plan view showing a protection circuit 5 and the periphery of the protection circuit 5 of the semiconductor device 1.

FIG. 2 is a cross sectional view showing the protection circuit 5 and the periphery of the protection circuit 5 of the semiconductor device 1.

As shown in FIG. 1, an internal circuitry 7 and an aluminum pad 9 are formed on a major surface of a semiconductor substrate 3. The internal circuitry 7 is a circuit to be protected from the electrostatic discharge. The aluminum pad 9 is connected to the internal circuitry 7.

A protection circuit 6, which protects the internal circuitry 7 from a surge voltage applied to the aluminum pad 9, is formed on and in the semiconductor substrate 3.

As shown in FIG. 2, the protection circuit 5 includes a transistor 11 which is formed in a surface region 3b of the major surface 3a and a control terminal 13 which is provided on the major surface 3a over the transistor 11.

The transistor 11 has a first region 11a of an n-type active region which serves as source/drain or collector/emitter, a second region 11b of the n-type active region which serves as drain/source or emitter/collector and a third region of a p-type active region 11c which separates the first region 11a and the second region 11b and which serves as a base.

The transistor 11 is an n-type MOS transistor having the control terminal as a gate and also is a parasitic NPN transistor having the first region 11a of relatively small length as the emitter.

An insulating film 15 is formed between the first region 11a and the control terminal 13 and is formed between the second region 11b and the control terminal 13. Therefore, the first region 11a is protected from directly contacting the control terminal 13. The second region 11b is protected from directly contacting the control terminal 13 as well.

The third region 11c is formed directly under the control terminal 13 so as to contact with the control terminal 13. On/Off states of the transistor 11 are controlled by applying a control voltage to the control terminal 13.

The second region 11b is formed in a surface region 3b of the periphery of a grid line 17. The grid line 17 is used as a scribe line for the semiconductor substrate 3. The first region 11a is formed in the surface region 3b of the periphery of the aluminum pad 9 so that a part of the first region 11a is contact with the aluminum pad 9.

Furthermore, a well region 21 of the n-type is formed under the second region 11b. The well region 21 prevents the semiconductor substrate 3 from bending. However, the well region 21 may not been provided if the bend of the semiconductor substrate 3 can be prevented by another way.

In a case where the well region 21 is not formed in the semiconductor substrate 3, since spreading an depletion layer can be prevented compare to a case where the well region 21 is formed, a parasitic capacitance between the semiconductor substrate 3 and the second region 11b become large. Therefore, it is possible to drop a peak voltage of the surge voltage applied to the second region 11b. As a result, such this structure can improve the effect of the ESD protection.

Furthermore, in the semiconductor device 1, there is a possibility that the surge voltage occurs around the grid line 17 during the semiconductor substrate 3 is being scribed. Therefore, if an impedance element for buffering the surge voltage is included in a region between the grid line 17 and the aluminum pad 9, the transistor 11 can be easily protected from damage during the scribing.

However, when a distance E between the aluminum pad 9 and the control terminal 13 increases, a relatively long time is needed to transfer an electrical charge occurred around the aluminum pad 9 to the second region 11b. Thus, there is a possibility that maintaining the effect of the ESD protection to the internal circuitry 7 is difficult. In order to overcome the difficulty, it is preferable that giving am appropriate resistive element to the second region 11b by adjusting a distance D between the grid line 17 and the control terminal 13. For example, the distance D is set longer than the distance E. A structure to connect a capacitor to the second region 11b may also be possible. A structure to utilize a parasitic capacitance existed around the second region 11b may also be possible.

Figure 3:
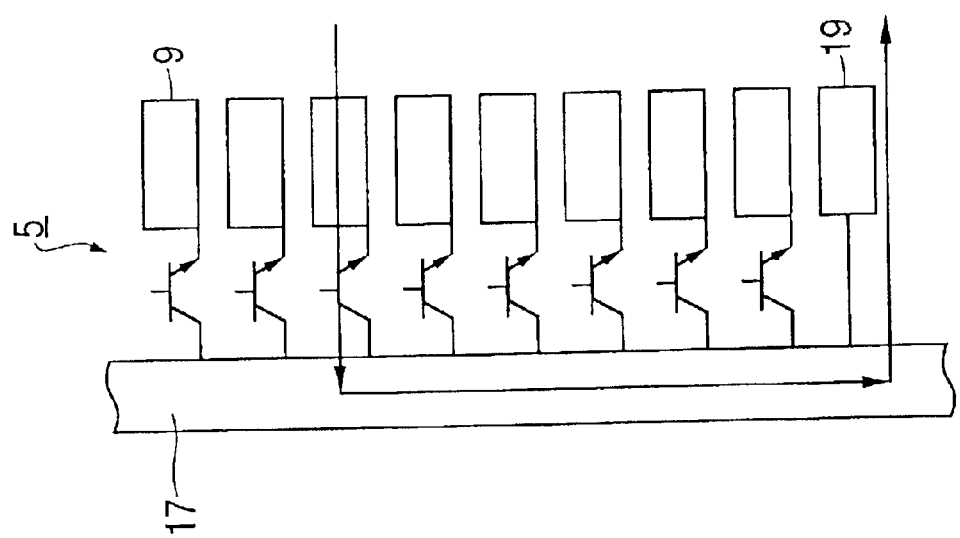
FIG. 3 is a schematic view showing a variation of the semiconductor device according to the preferred embodiment of the present invention.

In the preferred embodiment, as shown in FIG. 3, a structure that a plurality of protection circuits 5 share one grid line 17 may be used. In this structure, a surge voltage applied to one of the protection circuits 5 may be distributed to other protection circuits 5 through the grid line 17. Therefore, the surge buffered by one protection circuit 5 may be reduced.

In FIG. 3, furthermore, when the number of protection circuits 5 which share one grid line 17 is set to a relatively large number, sufficient ESD protection can be obtained without connecting a voltage source to the grid line 17 through the electrode 19. That is, in the preferred embodiment, a floating structure as illustrated in FIG. 4 may also be adopted.

Next, a method of fabricating the semiconductor device 1 according to the preferred embodiment of the present invention is explained with reference to the FIG. 2.

The method of fabricating the semiconductor device 1 includes a step for forming the protection circuit 5 and a step for ESD protecting the internal circuitry 7. The method also includes a step for forming the internal circuitry and a step for scribing the semiconductor substrate 3 to utilize the grid line 17 as the scribe line.

In the step for forming the protection circuit 5, the n-type impurity is implanted into the p-type semiconductor substrate 3 from the major surface 3a by ion implantation technique and thus the well region 21 is formed below the grid line 17.

Next, the n-type impurity is implanted into the surface region 3b of the semiconductor substrate 3 from the major surface 3a by the ion implantation technique. Thus, the first region 11a and the second region 11b are formed at a predetermined interval. The concentration of the first region 11a and the second region 11b is set to a predetermined value higher than that of the well region 21. As a result, the third region 11c is formed between the first region 11a and the second region 11b and a junction structure of the transistor 11 made up of the first region 11a, the second region 11b and the third region 11c is obtained.

In this preferred embodiment, the second region 11b is formed below the grid line 17 utilized as the scribe line of the semiconductor substrate 3. Therefore, in this preferred embodiment, a part of the transistor 11 of the protection circuit 5 is formed at a location where the scribe line will be provided.

Next, the insulating film 15 is formed on the major surface 3a. The insulating film 15 is removed so as to expose the third region 11c and a part of and the internal circuitry 7 side of the first region 11a. Thereafter, the control terminal 13 is formed over the exposed major surface 3a of the third region 11c. The aluminum pad 9 is formed on the exposed major surface 3a of the first region 11a. As a result, the protection circuit 5 according to the preferred embodiment is formed on and in the semiconductor substrate 3 of the semiconductor device 1.

In the method of fabricating the semiconductor device according to the preferred embodiment, the ESD protection to the internal circuitry is executed by the protection circuit 6 in a predetermined step. When the protection circuit protects the internal circuitry 7 from the ESD, an H level is set to the grid line 17 through the electrode 19. Thereby, a junction between the second region 11b and the third region 11c is fixed at a backward biased state, In this time, since a potential of the control terminal 13 is set at an L level, the transistor 11 enters into an off state.

In this state, even if a normal voltage having a positive polarity is applied to the aluminum pad 9, current does not flow to the protection circuit 6 side and thus the normal voltage is transferred to the internal circuitry 7.

On the other hand, when an abnormal voltage having the positive polarity (an excessive voltage), i.e., the surge voltage, is applied to the aluminum pad 9, the charge occurred by the excessive voltage is passed through the third region 11c, the second region 11b and grid line 17. And finally, the excessive voltage is transferred to the electrode 19. That is, the internal circuitry 7 is protected from the excessive voltage applied to the aluminum pad 9.

The aluminum pad is explained as an example of the connection terminal in this preferred embodiment, however, the present invention is not limited to this feature. A variety of connection terminals, e.g., Copper, Gold or other metal pad or the like, may be used in the semiconductor device 1.

In this preferred embodiment, since the semiconductor device and method of fabricating the same having the second region formed under the grid line are explained as an example, however, the present invention is not limited to this feature. That is, the semiconductor device and method of fabricating the same having the second region formed under a aluminum wiring applied to a ground potential or under a well region may be used as the present invention.

In the present invention, a part of the protection circuit is formed at a location where the scribe line is provided. The scribe line is a region which is cut away from the semiconductor substrate. That is, the scribe line is unnecessary region for a circuit element. Therefore, the present invention ensures enough regions to form internal circuitry and can protect the internal circuitry from the ESD.

Furthermore, since a plurality of protection circuits share the second region of the transistor, a circuit area per one connection terminal can decrease.

While the preferred form of the present invention has been described, it is to be understood that modifications will be apparent to those skilled in the art without departing from the spirit of the invention.

The scope of the invention, namely, is to be determined solely by the following claims.

What is claimed is:

1. A method of fabricating a semiconductor device having a semiconductor substrate, the method comprising:

forming an internal circuitry on said semiconductor substrate, the internal circuitry executing a predetermined operation;

forming a terminal on said semiconductor substrate, the terminal being connected to the internal circuitry and receiving an external signal;

forming a protection circuitry on said semiconductor substrate, wherein the protection circuitry includes a transistor which has a first region of a first conductivity type, a second region of the first conductivity type and a third region of a second conductivity type, wherein the first region is connected to the terminal, wherein the second region is provided at a scribe line of said semiconductor substrate and wherein the third region is defined by a region between the first region and the second region; and protecting the internal circuitry from a surge voltage occurred at the terminal by using the transistor.

2. A semiconductor device as set forth in claim 1, wherein the first and second regions are formed by introducing impurity.

3. A semiconductor device as set forth in claim 2, wherein the introducing impurity is executed by using an ion implantation.

4. A semiconductor device as set forth in claim 1, wherein a potential of the third region is in controlled so that the transistor is an off state.

* * * * *